Aug. 31, 1954 E. O. KEIZER ET AL 2,688,085

AUTOMATIC FREQUENCY CONTROL

Filed March 22, 1950 3 Sheets-Sheet 1

DIELECTRIC PROPERTIES OF 90% (70/30 Ba Sr $TiO_3$) +10% Ca$TiO_3$ ABOVE THE CURIE TEMPERATURE.

INVENTORS
EUGENE O. KEIZER,
HUGH L. DONLEY AND
CHANDLER WENTWORTH
BY Harry Tunick
ATTORNEY RADIO FREQUENCY HEATING OF TITANATE COMPOSITION 90% (70/30 Ba/Sr TiO3) + 10% CaTiO3; CAPACITOR DIMENSIONS 10 MILS SQUARE X 7 MILS THICK INVENTORS
EUGENE O. KEIZER,
HUGH L. DONLEY AND
CHANDLER WENTWORTH
BY Harry Tunick
ATTORNEY INVENTORS
EUGENE O. KEIZER
HUGH L. DONLEY
CHANDLER WENTWORTH
BY Harry Tunick
ATTORNEY Patented Aug. 31, 1954

2,688,085

UNITED STATES PATENT OFFICE 2,688,085

AUTOMATIC FREQUENCY CONTROL

Eugene O. Keizer, Hugh L. Donley, and Chandler Wentworth, Princeton, N. J., assignors to Radio Corporation of America, a corporation of Delaware Application March 22, 1950, Serial No. 151,256

8 Claims. (Cl. 250—36)

This invention relates to automatic frequency control (AFC) systems. More particularly, it relates to a circuit and thermal AFC unit useful in a television (TV) receiver. Such a system can be used to automatically control the frequency of a TV receiver's local oscillator. However, it isn't to be thought limited to this use. It can have other uses. For example, it can be used in a frequency modulation (FM) receiver. Also, it can be used for remote tuning of an oscillator.

Generally, the circuit and thermal unit now described is of the type disclosed in the copending Donley et al. application, Serial No. 146,166, filed February 25, 1950, which ripened on May 19, 1953 into Patent #2,639,376. The prior disclosure's unit consists of a temperature-responsive capacitor heated by an electric heater. The heater's heating effect depends on a control voltage. This control voltage varies in response to changes in the frequency being controlled. In this way, changes in the capacitor's capacitance are produced in response to changes in the frequency being controlled. The capacitor is coupled to an oscillator to be controlled, in such a way that the capacitor's capacitance changes produce changes in the oscillator frequency.

The present invention is an improvement over that shown in said application. An object of this invention is to simplify the construction of the AFC unit shown in said application.

Another object is to devise a unit which is less expensive than that of said application.

A further object is to provide a novel system for remote tuning of an oscillator.

A still further object is to devise a thermal AFC arrangement in which the heater for the thermal unit is eliminated.

Yet another object is to devise a thermal AFC system which will operate much faster than those previously known.

The foregoing and other objects of this invention will be best understood from the following description of an example thereof, reference being had to the accompanying drawings, wherein.

The invention's objects are accomplished, briefly, in the following manner: A capacitor which is somewhat lossy, and which has high temperature coefficient of capacitance, is connected to a source of radio frequency (R. F.)

voltage. This capacitor is arranged to be heated by this source's R. F. voltage. This source is also the oscillator whose frequency is to be controlled. A control voltage is derived, this voltage changing in response to changes in the oscillator frequency. This control voltage is used to change the oscillator's R. F. voltage output. This change in voltage output will in turn change the control capacitor's temperature. This change in temperature will change the capacitor's capacitance. The capacitor is part of the oscillator's frequency-determining circuit. Changes in the capacitor's capacitance therefore produce corresponding changes in the oscillator's frequency.

Figure 1:
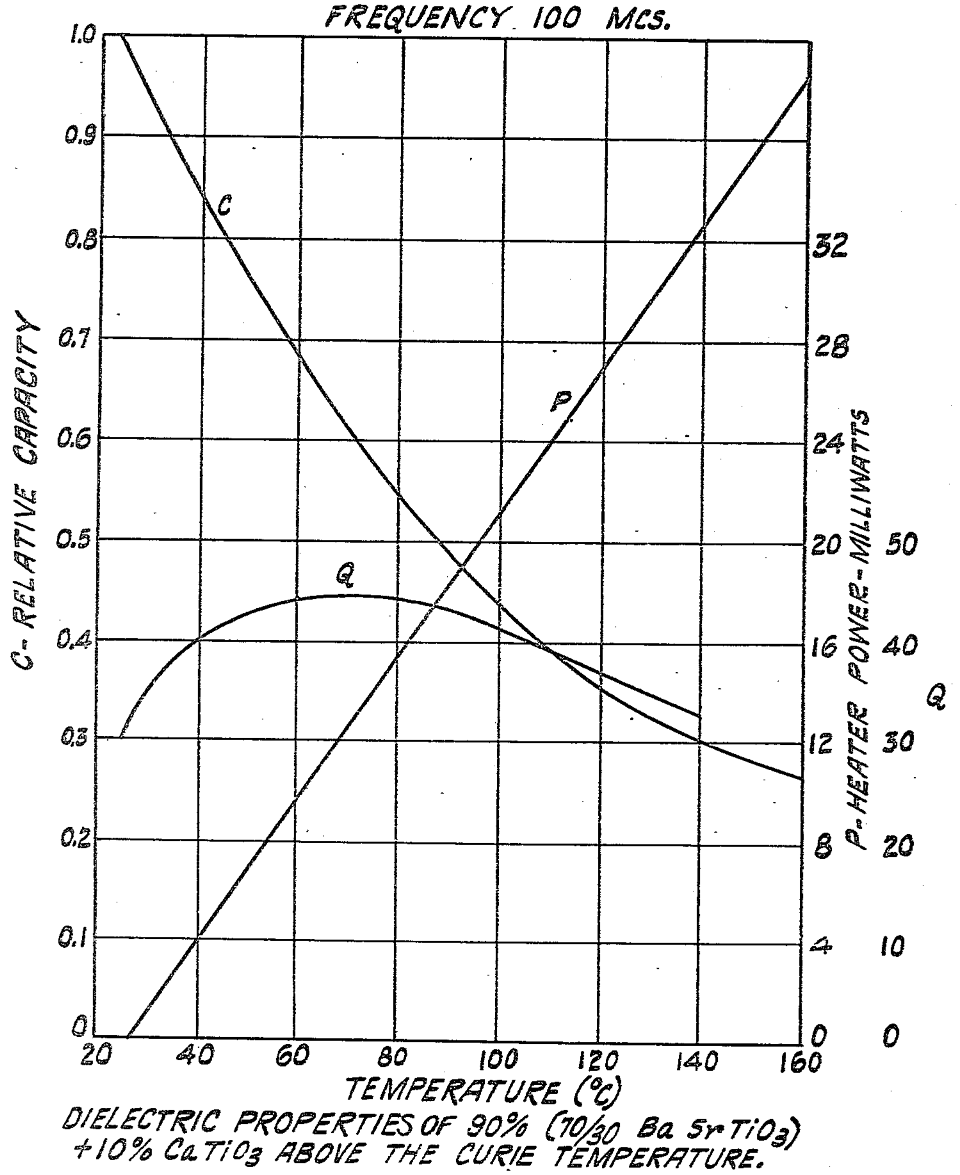
Figs. 1 and 2 are curves useful in explaining the operation of the invention.

As described in said application, certain titanate materials have very high dielectric constants. Also, such materials have extremely high temperature coefficients of capacitance. In Fig. 1, the curve labeled C, for which relative capacitance is plotted against temperature, indicates the extremely rapid drop in capacitance with temperature rise for a typical unit. The tested unit's composition is stated in the legend in Fig. 1. The variation of Q with temperature is shown by the curve labeled Q in Fig. 1. The curves of Fig. 1 were obtained with a small dielectric unit about 10 mils square by 7 mils thick, with an attached heater of roughly the same size. The curve labeled P shows the relation between the heater power and the capacitor's temperature.

As described in said application, a titanate dielectric element's temperature may be changed to change its capacitance. This temperature is controlled by a frequency control voltage. The resulting capacitance changes are utilized to effect AFC.

Another requirement, in addition to the capacitor's high temperature coefficient of capacitance, is that it be somewhat lossy. In this invention, the heating effect produced by dielectric losses resulting from the application of R. F. voltage, is utilized. According to prior practice, for low applied voltages this heating effect is negligible in a low-loss dielectric of small capacitance-temperature coefficient. However, only a few volts at frequencies of 50 megacycles or higher applied to a small titanate capacitor results in a large capacitance change. We'll consider the capacitor's equivalent circuit to be a perfect capacitor, C, in shunt with an equivalent resistance R. The power dissipated in the capacitor is given by $$P=\frac{E^2}{R}=\frac{E^2}{QX}=\omega C\frac{E^2}{Q}$$

In the above, E is the R. M. S. voltage applied and Q is the "shunt" Q of the capacitor, which is $R/X$. X is the reactance of the capacitor C at angular frequency $\omega$.

Thus, the power dissipated varies directly as the frequency, assuming constant Q for a given frequency range. A practical capacitance value for 100 megacycles and 100° C. operating temperature is 5 micromicrofarads. From the curve P in Fig. 1, a power of about 0.02 watt is needed to reach the 100° C. operating point. From curve Q, the capacitor's Q at this temperature is about 40. Using the expression given above, a calculation shows that only about 16 volts is necessary to heat the capacitor to 100° C.

Figure 2:
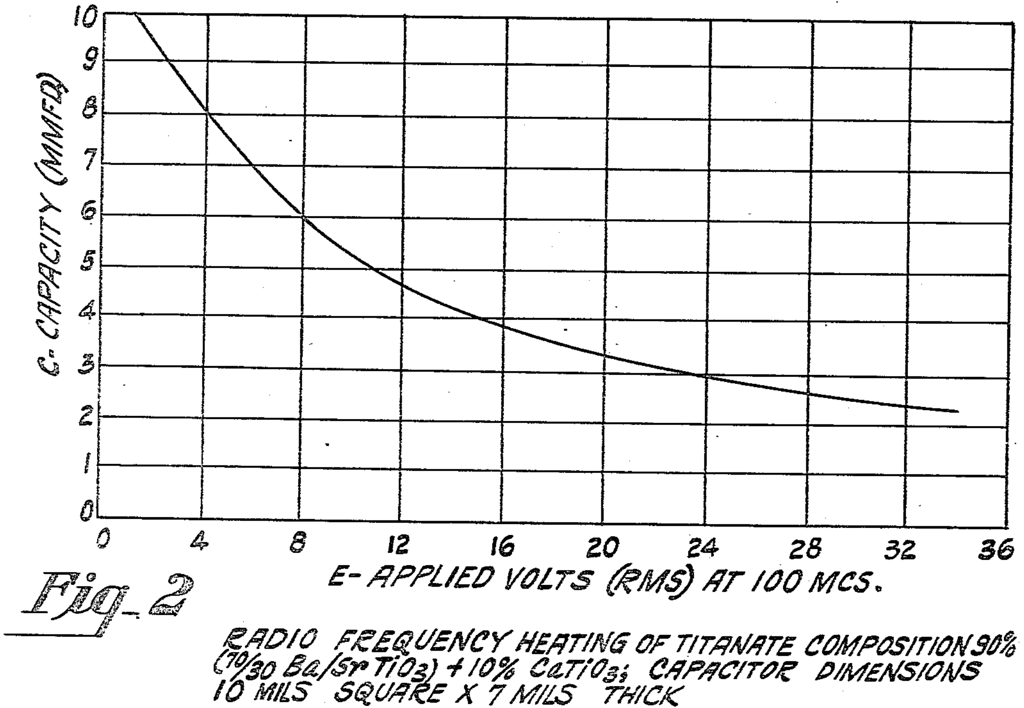

In Fig. 2, the measured capacitance, for a capacitor of about 10 micromicrofarads at room temperature, is plotted against applied R. F. voltage. The accuracy of the calculation just made may be shown by reference to Fig. 2. Comparison of the curve C, Fig. 1 and of the curve of Fig. 2 shows that 12 volts at 100 megacycles was enough to raise the temperature of the dielectric to about 100° C. From Fig. 2, it can be seen that the change in capacitance with R. F. voltage is large.

With little effort in oscillator design, sufficient voltage, at 100–200 megacycles, can readily be obtained to heat the capacitor to a temperature well above normal ambient temperature. As may be seen from the expression for power given above, the power usable for heating the capacitor is directly proportional to the frequency. The heating of the capacitor by R. F. voltage, as in this invention, is therefore practical only at high frequencies, since at lower frequencies too much voltage is required for the needed heating power. Obviously, larger size units require more power or oscillator voltage to heat the ceramic capacitor. Therefore, for high frequency receiver applications it becomes impractical to use a unit much larger than the size indicated in connection with Fig. 2.

As has been explained, according to the present invention the separate heater disclosed in said application has been entirely eliminated. In the present thermal capacitors, heating is effected by application of R. F. voltages thereto. The chief advantage of the "heaterless" type of construction is that it is very simple in construction and its cost is very low. For example, one method of construction is to add a little turpentine to the unfired titanate mixture to make a paste and to lay a bead of this paste on two fine platinum wires. This is dried at 100° C. and then fired at 2400° to 2600° F. in oxygen or air. The bead's size and the wires' spacing determine the capacitance of the unit. This method can easily be used in mass production. Also, the titanate material's cost is negligible and the platinum wires' cost is on the order of a cent per AFC unit in large quantities. Therefore, the unit's total cost is very low.

As has been explained, when R. F. voltages are applied to a capacitor of the kind described, the material's dielectric constant and capacitance will change due to the R. F. heating. Thus, the value of capacitance can be controlled by controlling the applied R. F. voltage's amplitude. It may be noted that the power dissipated in the capacitor, and therefore its temperature, depends upon the R. F. voltage, E, applied. The applied R. F. voltage can be changed by changing the plate voltage of an oscillator supplying such voltage. If the oscillator plate voltage is made dependent upon the D. C. voltage of a discriminator detector in an FM or TV receiver, then the capacitance of the temperature-responsive capacitor, which is part of the oscillator's frequency-determining circuit, can be made to correct the oscillator's frequency shift.

Figure 3:
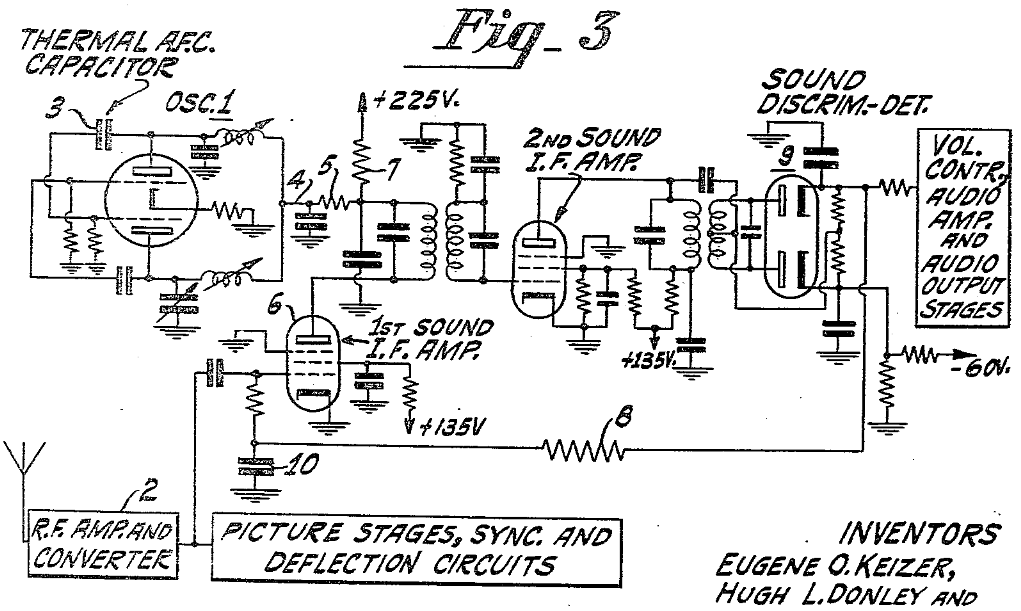
Fig. 3 is a schematic diagram of an AFC system of this invention.

The R. F. heater or "heaterless" type of thermal capacitor described can be used for AFC of high frequency receivers. Fig. 3 illustrates the use of one of the units described in a TV receiver of applicants' assignee's manufacture, to provide AFC of the local oscillator. The oscillator 1 is the superheterodyne oscillator to be controlled. This oscillator operates at R. F. and has its output coupled in any well-known manner (not shown) to the converter stage in block 2. The thermal AFC capacitor 3 is substituted for one of the oscillator's coupling capacitors. Capacitor 3 consists of a titanate dielectric mass separating two electrodes and may be constructed in the manner previously described. This capacitor unit with a characteristic about as shown in Fig. 2 had an operating capacitance of about 4 micromicrofarads. The unit 3 replaces one of the grid-to-plate capacitors in the oscillator 1 circuit. The oscillator plate return lead 4 is connected through a resistor 5 to the plate return lead of the first sound intermediate frequency amplifier tube 6. A common resistor 7, having a value of 20,000 ohms for example, is connected from these leads' junction point to the 225-volt plate supply. The first sound I. F. stage 6 serves as the control tube. The grid return of this stage is D. C. coupled through a series resistor 8 to the output of sound discriminator 9. The resistor 8 and a condenser 10 connected from one end thereof to ground constitute an RC filter for audio frequency removal.

The plate current of tube 6 is large compared to that of oscillator 1, being in fact on the order of twice as large. Therefore, the voltage drop across resistor 7 is almost all due to the plate current drawn by I. F. stage tube 6. A change in D. C. voltage output of discriminator 9 changes the current through the tube 6, which may be of the 6AU6 type. Because of the common plate resistor 7, this in turn changes the oscillator plate supply voltage. The R. F. voltage output of the oscillator is changed because of this change of plate supply voltage. This in turn changes the amount of energy supplied by the oscillator 1 to the capacitor 3, changing the R. F. heating effect of oscillator 1. In this way, the temperature of capacitor 3 is caused to change, changing the capacitance of this temperature-responsive capacitor. This change in capacitance changes the tuning of oscillator 1. The oscillator tuning therefore depends upon the D. C. output of the discriminator. With correct discriminator polarity, the change in tuning of oscillator 1 is such as to improve the accuracy of the oscillator's tuning. The operation of this receiver was good. Each of the channels normally received in the Princeton area was automatically tuned in by the AFC action without requiring use of the fine tuning control after turning of the channel selector switch.

The oscillator's frequency also varies slightly when its plate supply voltage is changed, but the sensitivity of the AFC system is great enough to make this frequency change negligible.

The thermal capacitors of the invention possess sufficient sensitivity to control the local oscillator frequency using an existing tube 6 in the receiver as a D. C. amplifier of the discriminator voltage without noticeably interfering with that tube's normal function as an I. F. amplifier.

Figure 4:
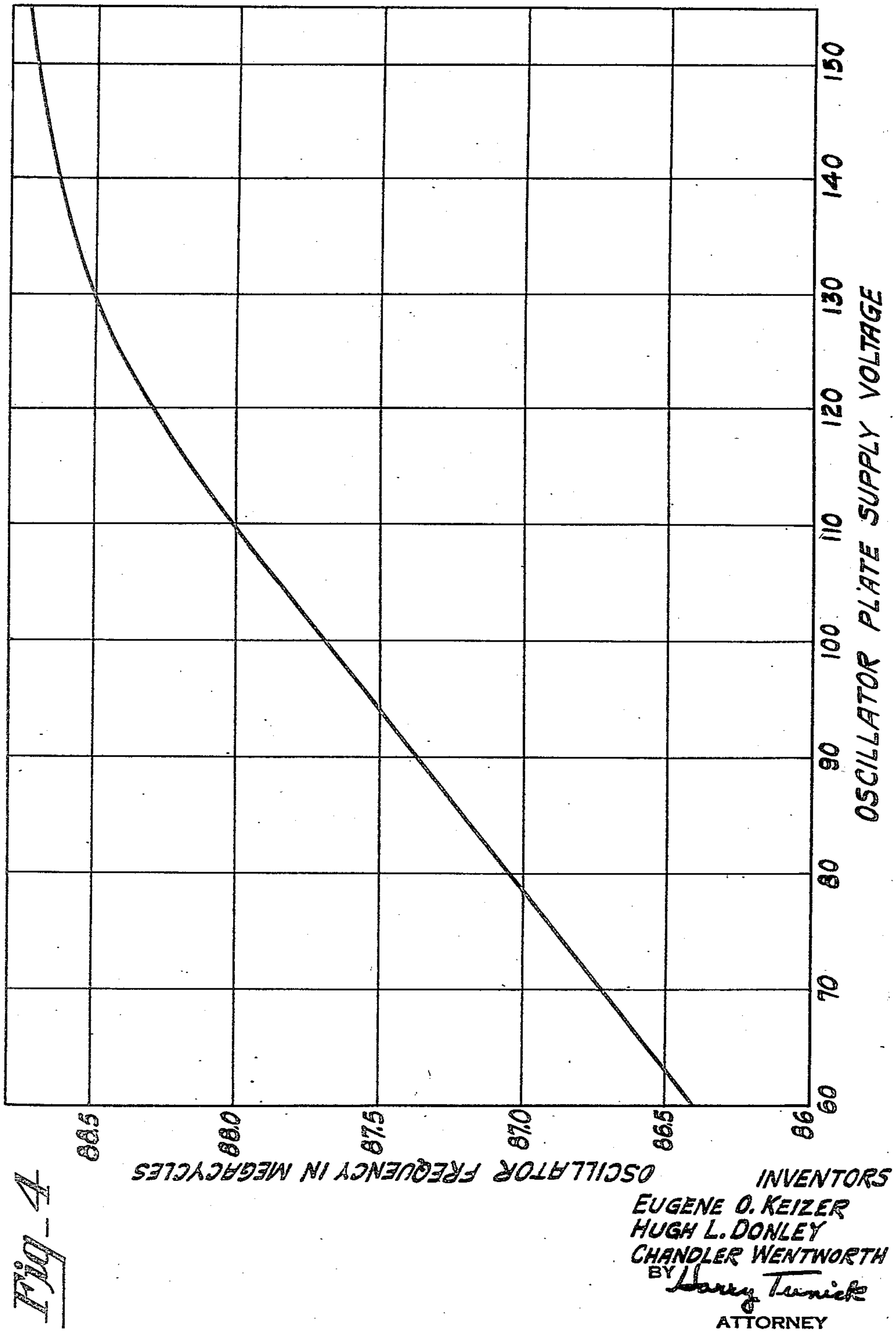
Fig. 4 is a curve useful in explaining the invention.

Fig. 4 is a curve showing change of oscillator frequency with oscillator plate supply voltage. The data for this curve were taken for a typical oscillator circuit such as previously described, with a thermally sensitive capacitor, heated by oscillatory energy alone, in the oscillator circuit. It will be noted that the curve of Fig. 4 is substantially linear over the greater part of its length.

It has been found that it is possible to decouple capacitor 3 from the oscillator somewhat and yet have sufficient AFC sensitivity.

Since the oscillator frequency varies as a function of its plate supply voltage according to this invention, remote tuning of an oscillator can be effected by merely controlling its plate supply voltage. One application of the R. F. heated units of this invention is to effect such remote tuning.

It has been found that for the thermal units it is better to place the two electrodes on the same side of the ceramic body rather than on opposite sides. The electrodes are, of course, spaced from each other when placed on the same side of the ceramic body. For this specification's purposes, the construction wherein the electrodes are on opposite sides of the ceramic body will be termed the "normal construction." In AFC applications, many of the units of normal construction produced a crackling background noise when a carrier was tuned in on the receiver. On the other hand, those constructed with both electrodes on the same side of the dielectric were quiet. Therefore, this latter construction will be termed the "low-noise construction." When the oscillator voltage is low, on the order of one volt, both the normal and low-noise constructions are quiet. However, when the oscillator voltage is on the order of 5 to 20 volts, units of normal construction will very likely be noisy for the very small sizes of capacitors used in R. F. heated AFC units. It might be possible to make the ceramic bodies of the normal construction a little thicker, to reduce noise. However, in this case more R. F. voltage from the oscillator would be required for heating, since in this case the capacitor unit's mass would be larger.

It should be noted that an FM or TV receiver's discriminator's D. C. output is proportional to the frequency shift or drift of the receiver's local oscillator. This frequency shift is with respect to a predetermined frequency. Therefore, since the thermal capacitor's temperature depends on the oscillator plate voltage, which in turn depends on the discriminator D. C. output, the resultant AFC action corrects the local oscillator's frequency shift.

The thermal capacitor of this invention is nonmicrophonic. Also, a practically instantaneous AFC system may be provided.

As compared to the copending application's heater-type thermal capacitors, the present heaterless-type units provide faster operation. This is so because there is less total mass (the mass of the heater being eliminated) and because the dielectric is heated directly.

Since this invention's capacitors absorb almost negligible power from the R. F. oscillator, there is no possibility of absorbing an amount of power therefrom sufficient to cause this oscillator to stop oscillating.

The construction of the thermal AFC capacitor of this invention is somewhat similar to that disclosed in said copending application, except that both the main and auxiliary heaters disclosed in the said application are eliminated. In other words, the capacitor of this invention may consist of a dielectric body having the composition indicated in Figs. 1 and 2 and provided with two electrodes. The two electrodes are connected into the circuit as disclosed in Fig. 3 herein.

What we claim to be our invention is:

1. An automatic frequency control system, comprising an oscillator the frequency of which is to be controlled, a capacitor coupled to the frequency-determining circuit of said oscillator to receive oscillatory energy therefrom to heat said capacitor by dielectric losses therein, the capacitance of said capacitor varying with the temperature thereof, and circuit means responsive to drifts of the oscillator frequency from a predetermined value for varying the plate supply voltage of said oscillator, thereby varying the magnitude of the oscillatory output voltage of said oscillator and also the magnitude of the oscillatory energy supplied to said capacitor.

2. An automatic frequency control system, comprising an oscillator the frequency of which is to be controlled, a capacitor coupled to the frequency-determining circuit of said oscillator to receive oscillatory energy therefrom to heat said capacitor by dielectric losses therein, the capacitance of said capacitor varying with the temperature thereof, means responsive to drifts of the oscillator frequency from a predetermined value for producing a control voltage dependent upon such drifts, and circuit means controlled by said control voltage for varying the plate supply voltage of said oscillator, to thereby vary the magnitude of the oscillatory output voltage of said oscillator and also the magnitude of the oscillatory energy supplied to said capacitor.

3. In a receiver of angle modulated wave energy, a local heterodyne oscillator the frequency of which is to be controlled, a capacitor coupled to the frequency-determining circuit of said oscillator to receive oscillatory energy therefrom to heat said capacitor by dielectric losses therein, the capacitance of said capacitor varying with the temperature thereof, a discriminator detector for producing a direct voltage dependent upon drifts of the oscillator frequency from a predetermined value, and circuit means controlled by said direct voltage for varying the plate supply voltage of said oscillator, to thereby vary the magnitude of the oscillatory output voltage of said oscillator and also the magnitude of the oscillatory energy supplied to said capacitor.

4. In a receiver of angle modulated wave energy, a local heterodyne oscillator the frequency of which is to be controlled, a capacitor coupled to the frequency-determining circuit of said oscillator to receive oscillatory energy therefrom to heat said capacitor by dielectric losses therein, the capacitance of said capacitor varying with the temperature thereof, a discriminator detector for producing a direct voltage dependent upon drifts of the oscillator frequency from a predetermined value, an electron discharge device having an input electrode direct current coupled to said discriminator detector and receptive of said direct voltage, and resistor means responsive to the flow of current in said device for controlling the plate supply voltage of said oscillator, to thereby control the magnitude of the oscillatory output voltage of said oscillator and also the magnitude of the oscillatory energy supplied to said capacitor.

5. A receiver as defined in claim 4, wherein said resistor means includes a plate resistor common to the plate of said device and to the plate of said oscillator.

6. An automatic frequency control system comprising an oscillator the frequency of which is to be controlled, a temperature-responsive capacitor the capacitance of which varies with the temperature thereof, means so coupling said capacitor to the frequency-determining circuit of said oscillator as to cause oscillatory energy from said oscillator to flow through said capacitor, such flow of oscillatory energy acting to heat said capacitor by dielectric losses therein and to vary the capacitance of said capacitor, and circuit means responsive to drifts of the oscillator frequency from a predetermined value for varying the magnitude of the oscillatory output voltage of said oscillator and thereby also the magnitude of the oscillatory energy flowing through said capacitor.

7. An automatic frequency control system comprising an oscillator the frequency of which is to be controlled, a temperature-responsive capacitor the capacitance of which varies with the temperature thereof, means so coupling said capacitor to the frequency-determining circuit of said oscillator as to cause oscillatory energy from said oscillator to flow through said capacitor, such flow of oscillatory energy acting to heat said capacitor by dielectric losses therein and to vary the capacitance of said capacitor, means responsive to drifts of the oscillator frequency from a predetermined value for producing a control voltage dependent upon such drifts, and circuit means controlled by said control voltage for varying the magnitude of the oscillatory output voltage of said oscillator and thereby also the magnitude of the oscillatory energy flowing through said capacitor.

8. In a receiver of angle modulated wave energy, a local heterodyne oscillator the frequency of which is to be controlled, a temperature-responsive capacitor the capacitance of which varies with the temperature thereof, means so coupling said capacitor to the frequency-determining circuit of said oscillator as to cause oscillatory energy from said oscillator to flow through said capacitor, such flow of oscillatory energy acting to heat said capacitor by dielectric losses therein and to vary the capacitance of said capacitor, a discriminator detector for producing a direct voltage dependent upon drifts of the oscillator frequency from a predetermined value, and circuit means controlled by said direct voltage for varying the magnitude of the oscillatory output voltage of said oscillator and thereby also the magnitude of the oscillatory energy flowing through said capacitor.

References Cited in the file of this patent

UNITED STATES PATENTS

| Number | Name | Date |
|---|---|---|
| 1,994,228 | Osnos | Mar. 12, 1935 |
| 2,019,765 | Osnos | Nov. 5, 1935 |
| 2,210,406 | Henderson | Aug. 6, 1940 |
| 2,233,198 | Dome | Feb. 25, 1941 |
| 2,243,921 | Rust | June 3, 1941 |
| 2,461,307 | Antalek | Feb. 8, 1949 |
| 2,473,556 | Wiley | June 21, 1949 |
| 2,483,070 | Spindler | Sept. 27, 1949 |